US009281852B2

(12) United States Patent
Li et al.

(10) Patent No.: US 9,281,852 B2
(45) Date of Patent: Mar. 8, 2016

(54) METHOD AND APPARATUS FOR CALIBRATING TIME ALIGNMENT

(71) Applicant: Marvell World Trade Ltd., St. Michael (BB)

(72) Inventors: Qiang Li, Austin, TX (US); Brian T. Brunn, Bee Cave, TX (US)

(73) Assignee: MARVELL WORLD TRADE LTD., St. Michael (BB)

( * ) Notice: Subject to any disclaimer, the term of this patent is extended or adjusted under 35 U.S.C. 154(b) by 20 days.

(21) Appl. No.: 14/137,081

(22) Filed: Dec. 20, 2013

(65) Prior Publication Data

US 2014/0194080 A1 Jul. 10, 2014

Related U.S. Application Data

(60) Provisional application No. 61/749,101, filed on Jan. 4, 2013.

(51) Int. Cl.
| | |
|---|---|
| H04B 17/00 | (2015.01) |
| H04B 1/10 | (2006.01) |
| H03F 1/02 | (2006.01) |
| H03F 1/32 | (2006.01) |
| H04B 17/13 | (2015.01) |

(52) U.S. Cl.
CPC ............. *H04B 1/10* (2013.01); *H03F 1/025* (2013.01); *H03F 1/32* (2013.01); *H03F 2200/102* (2013.01); *H03F 2200/511* (2013.01); *H04B 17/0085* (2013.01); *H04B 17/13* (2015.01)

(58) Field of Classification Search
CPC ..... H03F 1/3247; H03F 1/3282; H03F 1/328; H03F 2200/1028; H03F 2201/32278; H03F 1/3288; H03F 2200/102; H03F 2201/3227; H04B 2001/0408; H04B 2001/0425; H04B 2001/0433; H04B 1/0475; H04B 17/0005; H04B 17/001; H04B 17/0015; H04B 17/0017; H04B 17/0032; H04B 17/0037; H04B 17/0085; H04B 17/102; H04B 17/13
USPC .......... 455/114.1, 114.3, 115.1, 115.2, 115.3, 455/67.11, 67.14, 67.13
See application file for complete search history.

(56) References Cited

U.S. PATENT DOCUMENTS

| | | | | | |
|---|---|---|---|---|---|
| 4,329,655 | A | * | 5/1982 | Nojima et al. | 330/149 |
| 4,882,547 | A | * | 11/1989 | Katz | 330/149 |
| 5,130,663 | A | * | 7/1992 | Tattersall, Jr. | 330/52 |

(Continued)

FOREIGN PATENT DOCUMENTS

| | | |
|---|---|---|
| KR | 10-2012-0070144 A | 6/2012 |
| WO | WO 2012/156470 A1 | 11/2012 |
| WO | WO 2012/170831 A1 | 12/2012 |

OTHER PUBLICATIONS

International Search Report and Written Opinion for PCT/US2013/077138, filed on Dec. 20, 2013.

*Primary Examiner* — Duc M Nguyen (57) ABSTRACT

A method includes setting a circuit to a mode. A test tone having a first frequency is provided to the circuit for use in calibrating the circuit. A received signal is generated based on an output signal of the circuit, the received signal including a component having a second frequency that is a harmonic of the first frequency. A magnitude of the component having the second frequency in the received signal is measured. A delay of the circuit corresponding to the mode is adjusted according to the magnitude of the component.

20 Claims, 9 Drawing Sheets

(56) References Cited

U.S. PATENT DOCUMENTS

| | | | |
|---|---|---|---|
| 5,877,653 A * | 3/1999 | Kim et al. .................... 330/149 |
| 7,053,709 B1 * | 5/2006 | Darvish-Zadeh et al. .... 330/149 |
| 2002/0094791 A1 * | 7/2002 | Pehlke et al. ................. 455/115 |
| 2002/0101938 A1 * | 8/2002 | Horaguchi et al. ........... 375/297 |
| 2003/0107434 A1 * | 6/2003 | Mitzlaff ........................ 330/149 |
| 2004/0116083 A1 * | 6/2004 | Suzuki et al. ................ 455/126 |
| 2005/0163254 A1 * | 7/2005 | Suzuki et al. ................ 375/297 |
| 2007/0249304 A1 * | 10/2007 | Snelgrove et al. ......... 455/127.2 |
| 2008/0080640 A1 * | 4/2008 | Rofougaran .......... H03F 1/0222 375/297 |
| 2008/0106333 A1 * | 5/2008 | Liu ............................... 330/149 |
| 2008/0192877 A1 * | 8/2008 | Eliezer et al. ................. 375/376 |
| 2009/0045872 A1 * | 2/2009 | Kenington ........... H04B 1/0475 330/127 |
| 2009/0233562 A1 * | 9/2009 | Kim et al. .................. 455/115.1 |
| 2010/0022208 A1 * | 1/2010 | Cole et al. .................. 455/114.3 |
| 2010/0039100 A1 | 2/2010 | Sun et al. |
| 2010/0060358 A1 * | 3/2010 | Nentwig ............... H03F 1/0211 330/199 |
| 2010/0329388 A1 | 12/2010 | Ko |
| 2011/0051791 A1 * | 3/2011 | Hammerschmidt et al. .. 375/226 |
| 2012/0196546 A1 * | 8/2012 | Ly-Gagnon ..................... 455/73 |
| 2015/0035606 A1 * | 2/2015 | Bartram ........................ 330/297 |

\* cited by examiner

Envelope Tracking (ET)

FIG. 4

Constant PA PS voltages

FIG. 5

Envelope Elimination and Restoration (EER)

METHOD AND APPARATUS FOR CALIBRATING TIME ALIGNMENT

CROSS-REFERENCE TO RELATED APPLICATION

This present disclosure claims the benefit of U.S. Provisional Application No. 61/749,101, "ON-CHIP TIME ALIGNMENT CALIBRATION TECHNIQUE FOR ENVELOPE TRACKING," filed on Jan. 4, 2013, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A Power Amplifier (PA) may at times have a gain different than a desired gain. A gain compression occurs when the PA gain is lower than the desired gain and a gain expansion occurs when the PA gain is higher than the desired gain. Variation in a PA power output and/or a PA supply voltage may cause gain compression or gain expansion. This may cause a system intended to operate with a constant gain ("an iso-gain system") to deviate from operating as intended.

Envelope tracking (ET) includes modulating one or more PA supply voltages according to a transmit (TX) signal envelope. ET may be used to increase PA efficiency when the TX signal has a high Peak-to-Average-Power Ratio (PAPR). ET may also be used to produce iso-gain operation of a PA.

A time alignment (TA) is a measure of the difference between a change in the TX signal envelope at the input of the PA and a corresponding change in a PA supply voltage. A mismatch of the TA occurs when the change in the TX signal envelope at the input of the PA occurs before or after the corresponding change in the PA supply voltage.

When the gain of the PA is dependent on the PA supply voltage or the PA power output, a mismatch of the TA produces a distortion in an output signal of the PA. The distortion in the output signal may produce interference between neighboring communication channels, including interference characterized by an Adjacent Channel Leakage-Power Ratio (ACLR).

SUMMARY

In an embodiment, a circuit includes a test tone generator to provide a test tone having a first frequency as a baseband signal for the circuit when the circuit is set to a mode, a power amplifier (PA) to receive an input signal modulated by the baseband signal, and an envelope tracking (ET) circuit. The ET circuit includes an ET delay circuit (ETDC) to modulate a power supply voltage of the PA according to an envelope of the baseband signal, and an ET delay feedback circuit to generate a received signal based on an output of the PA and measure a magnitude of a component having a second frequency in the received signal. The component having the second frequency is a harmonic of the first frequency. The ETDC adjusts a delay of the circuit corresponding to the mode according to the component.

In an embodiment, the ETDC is calibrated by setting the circuit to a second mode, providing a second test tone having a third frequency to the circuit for use in calibrating the circuit, generating a second received signal based on a second output signal of the circuit, measuring a magnitude of the component in the second received signal, and adjusting a second delay of the circuit corresponding to the second mode according to the magnitude of the component in the second received signal. The second received signal includes a component having a fourth frequency that is a harmonic of the third frequency.

In an embodiment, the ETDC is calibrated by setting a delay of the ETDC to a first delay value. When the delay of the ETDC is set to the first delay value, the magnitude of the component is measured to produce a first error component. The method also includes setting the delay of the ETDC to a second delay value. When the delay of the ETDC is set to the second delay value, the magnitude of the component is measured to produce a second error component. The first error component is compared to the second error component. When the first error component is less than the second error component, a delay calibration associated with the mode is set to the first delay value. When the first error component is not less than the second error component, the delay calibration associated with the mode is set to the second delay value.

In an embodiment, the circuit includes a transmitter.

In an embodiment, the ET circuit performs envelope tracking, and the delay is an envelope tracking time alignment delay.

In an embodiment, a method includes setting a circuit to a mode. A test tone having a first frequency is provided to the circuit for use in calibrating the circuit. A received signal is generated based on an output signal of the circuit, the received signal including a component having a second frequency that is a harmonic of the first frequency. A magnitude of the component having the second frequency in the received signal is measured. A delay of the circuit corresponding to the mode is adjusted according to the magnitude of the component.

In an embodiment, the method includes setting a circuit to a second mode. A second test tone having a third frequency is provided to the circuit for use in calibrating the circuit. A second received signal is generated based on a second output signal of the circuit, the second received signal including a component having a fourth frequency that is a harmonic of the third frequency. A magnitude of the component in the second received signal is measured. A second delay of the circuit corresponding to the second mode is adjusted according to the magnitude of the component in the second received signal.

In an embodiment, the method includes setting a delay of the circuit to a first delay value. When the delay of the circuit is set to the first delay value, the magnitude of the component is measured to produce a first error component. The method also includes setting the delay of the circuit to a second delay value. When the delay of the circuit is set to the second delay value, the magnitude of the component is measured to produce a second error component. The first error component is compared to the second error component. When the first error component is less than the second error component, a delay calibration associated with the mode is set to the first delay value. When the first error component is not less than the second error component, the delay calibration associated with the mode is set to the second delay value.

In an embodiment, the circuit includes a transmitter.

In an embodiment, the delay is an envelope tracking time alignment delay.

DETAILED DESCRIPTION

Figure 1:
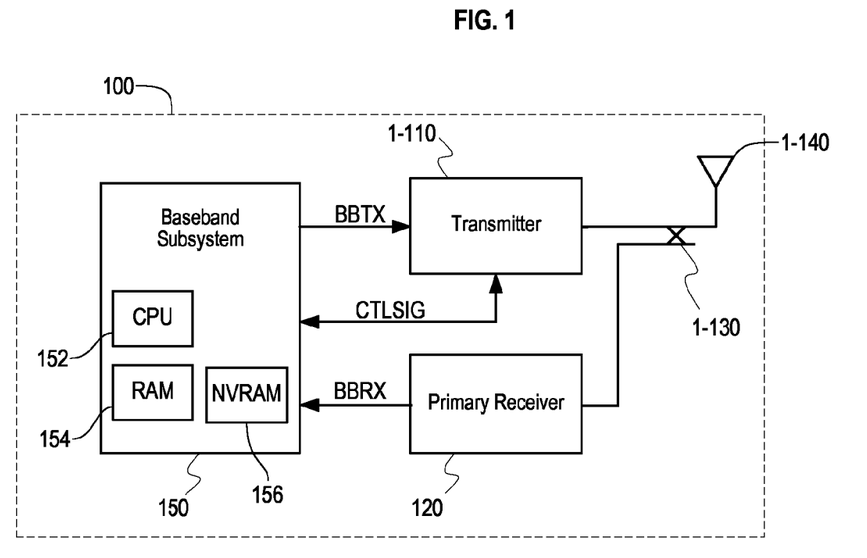
FIG. 1 is a block diagram of portions of a wireless device.

FIG. 1 is a block diagram of portions of a wireless device 100 including a transmitter 1-110. The transmitter 1-110 receives a baseband transmit signal BBTX from a baseband subsystem 150 and modulates a Radio Frequency (RF) carrier using the baseband transmit signal BBTX. A plurality of control signals CTLSIG connect the baseband subsystem 150 and the transmitter 1-110. The control signals CTLSIG include signals used to calibrate the transmitter 1-110.

The transmitter 1-110 transmits the modulated carrier using an antenna 140. The transmitter 1-110 is coupled to the antenna 140 through a directional coupler 1-130. A primary receiver 120 is coupled to the antenna 1-140 through the directional coupler 1-130.

The directional coupler 1-130 transfers a first portion of a power of an RF output signal produced by the transmitter 1-110 to the antenna 1-140 and a second portion of the power of the RF output signal to the primary receiver 120, the first portion being larger than the second portion. The directional coupler 1-130 also transfers a received signal from the antenna 1-140 to the primary receiver 120.

The primary receiver 120 receives RF signals from the antenna 1-140 through the directional coupler 1-130 and converts them to baseband receive signals BBRX. The baseband subsystem 150 receives the baseband receive signals BBRX from the primary receiver 1-120.

In an embodiment, the baseband subsystem 150 includes a Central Processor Unit (CPU) 152, a volatile Random Access Memory (RAM) 154, and a Non-Volatile RAM (NVRAM) 156. The RAM 154 is a non-transitory computer-readable medium including a static RAM, a dynamic RAM, and/or other similar memory devices. The NVRAM 156 is a non-transitory computer-readable medium including a Read-Only Memory (ROM), a Flash memory, an Electrically-Erasable Programmable ROM (EE-PROM), and/or other similar memory devices.

A person of skill in the art in light of the teachings and disclosures herein would understand that baseband subsystem 150 may include additional elements not shown in FIG. 1 including, for example, one or more of a bus, a Digital Signal Processor (DSP), a device adapter, a network adapter, and/or an input/output device.

By way of example and not by way of limitation, functions of the baseband processor 150 are provided by using the CPU 152 to execute computer program instructions stored on a non-transitory computer-readable media. In an embodiment, the functions of the baseband processor 150 include supervising or supporting a factory calibration of the transmitter 1-110, a power-up calibration of the transmitter 1-110, and/or a mode control of the transmitter 1-110. In an embodiment, functions associated herein with the baseband processor 150 are provided in whole or in part by one or more other components of the wireless device 100, such as a processor, a sequencer, or a state-machine incorporated within the transmitter 1-110 and/or an application processor.

Figure 2:
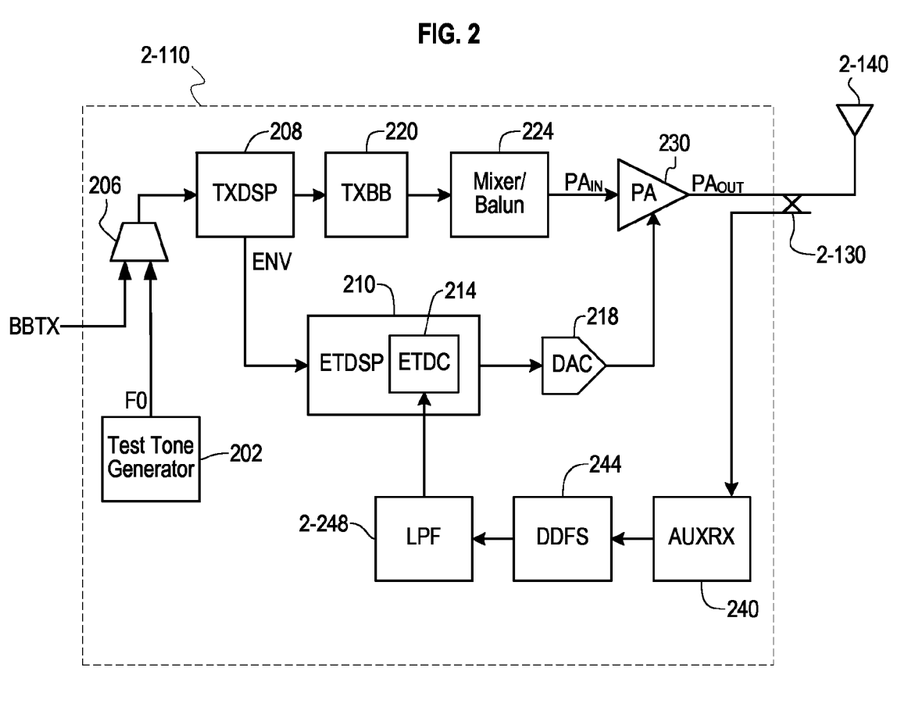
FIG. 2 is a circuit diagram of a transmitter in accordance with an embodiment.

FIG. 2 is a circuit diagram of a transmitter 2-110 in accordance with an embodiment. The transmitter 2-110 may be used as the transmitter 1-110 of the wireless device 100 of FIG. 1.

In the transmitter 2-110, a selector 206 selects a baseband transmit signal BBXT received by the transmitter 2-110 or a tone signal F0 generated by a test tone generator 202. The tone signal F0 is selected when a calibration operation is performed. The baseband transmit signal BBXT is selected when the tone signal F0 is not selected.

A transmitter DSP (TXDSP) 208 receives the signal selected by the selector 206. The TXDSP 208 performs digital signal processing to generate an envelope signal ENV according to the signal received from the selector 206. The TXDSP 208 also produces a processed baseband transmit signal using the signal received from the selector 206.

A transmit baseband circuit (TXBB) 220 receives the processed baseband transmit signal. The TXBB 220 produces a baseband output signal including phase and amplitude information according to the processed baseband transmit signal.

A balun/mixer 224 receives the baseband output signal. The balun/mixer 224 produces a phase and amplitude modulated RF signal $PA_{IN}$ using an RF carrier frequency and the phase and amplitude information included in the baseband output signal.

A Power Amplifier (PA) 230 receives the modulated RF signal $PA_{IN}$ and amplifies it to produce a PA output signal $PA_{OUT}$. The PA 230 producing the PA output signal $PA_{OUT}$ is coupled to antenna 2-140 using directional coupler 2-130.

The PA 230 also receives one or more power supply (PS) voltages from Digital to Analog Converter (DAC) 218. The DAC 218 produces the one or more PS voltages according to a PS control signal received from an Envelope Tracking DSP (ETDSP) 210 (or ET circuit). In an embodiment, the one or more PS voltages include a positive voltage $V+_{PA}$ and a negative voltage $V-_{PA}$. In an embodiment, a magnitude of the negative voltage $V-_{PA}$ is substantially equal to a magnitude of the positive voltage $V+_{PA}$.

The ETDSP 210 performs envelope tracking using the envelope signal ENV received from the TCDSP 208 to generate the PS control signal. The PS control signal causes the PS voltages generated by DAC 218 to increase and decrease in magnitude according to the magnitude of the envelope signal ENV.

The ETDSP 210 includes an Envelope Tracking Delay Circuit (ETDC) 214. The ETDC 214 delays the PS control signal by an ET delay interval corresponding to a difference between a propagation delay through a path including TXDSP 208, TXBB 220, Mixer/Balun 224, and/or PA 230 and a propagation delay through a path including TXDSP 208, ETDSP 210, DAC 218, and/or PA 230.

A person of skill in the art in light of the teachings and disclosure herein would understand that the ETDSP 210 and the TXDSP 208 may include one or more processors, RAMs and/or NVRAMs and may perform operations by executing computer program instructions embodied in a non-tangible medium such as a RAM and/or a NVRAM. A person of skill in the art in light of the teachings and disclosure herein would also understand that ETDSP 210 and the TXDSP 208 may be implemented without software using, for example, one or more hardware state machines.

An Auxiliary Receiver (AUXRX) 240 receives a portion of the PA output $PA_{OUT}$ from the directional coupler 2-130. The AUXRX 240 generates a gain signal (or received signal) corresponding to a gain of the transmitter 2-110 using the received portion of the PA output $PA_{OUT}$ and/or generates a baseband signal using the received portion of the PA output $PA_{OUT}$.

In an embodiment, AUXRX 240 is a receiver used in a power control loop of transmitter 2-110. In an embodiment, AUXRX 240 includes all or a portion of the primary receiver 120 shown in FIG. 1.

In an embodiment, the AUXRX 240 is a direct conversion receiver (also called a zero-IF receiver) that demodulates the received portion of the PA output $PA_{OUT}$ using a Local Oscillator (LO) frequency equal to or very close to the RF carrier frequency of the PA output $PA_{OUT}$. The AUXRX 240 includes an Analog to Digital Converter (ADC) that converts the gain signal and/or the baseband signal generated by the AUXRX 240 to a digital output signal. In an embodiment, the LO frequency is obtained from the same source as the RF carrier frequency used by the Mixer/Balun 224 of the main TX path.

A Discrete Digital Frequency Synthesizer (DDFS) 244 (or digital frequency synthesizer) receives a signal from the AUXRX 240. The DDFS 244 also generates an F0 harmonic signal having a frequency equal to a second or third harmonic of the tone signal F0 generated by the test tone generator 202. When the DDFS 244 receives a gain signal from the AUXRX 240, the F0 harmonic signal has a frequency equal to a second harmonic of the tone signal F0. When the DDFS 244 receives a baseband signal from the AUXRX 240, the F0 harmonic signal has a frequency equal to a third harmonic of the tone signal F0.

The DDFS 244 generates a DDFS output signal by using a frequency mixer to combine the signal received from the AUXRX 240 with the F0 harmonic signal. The DDFS output signal includes a signal corresponding to a magnitude of a component of the received signal having the frequency of the F0 harmonic signal.

In an embodiment, the signals received and generated by the DDFS 244 are digital signals. In an embodiment, the DDFS 244 generates the F0 harmonic signal using a Look-Up Table (LUT) and/or a COordinate Rotation DIgital Computer (CORDIC) algorithm.

In an embodiment, the DDFS 244 receives the gain signal corresponding to a gain of the transmitter 2-110 from the AUXRX 240 and generates an F0 harmonic signal having a frequency equal to a second harmonic of the tone signal F0. The DDFS output signal (or mixer output signal) therefore includes a substantially zero-frequency component, that is, a direct current (DC) component, corresponding to a magnitude of a second harmonic of the tone signal F0 in the gain of the transmitter 2-110. The DDFS output signal may also include higher frequency components.

In an embodiment, the DDFS 244 receives a baseband signal from the AUXRX 240 and generates an F0 harmonic signal corresponding to a frequency of three times a frequency of the tone signal F0. The DDFS output signal therefore includes a substantially zero-frequency component, that is, a DC component, corresponding to a magnitude of a third harmonic of the tone signal F0 in the baseband signal of the demodulated PA output signal $PA_{OUT}$. The DDFS output signal may also include higher frequency components.

A Low Pass Filter (LPF) 2-248 receives and low-pass filters the DDFS output signal to produce a filtered output signal. The filtered output signal includes low frequency components of the mixer output signal, including any DC component. The LPF 2-248 reduces the magnitude of any higher-frequency components of the DDFS output signal. In an embodiment, the LPF 2-248 is a single-pole LPF.

The AUXRX 240, DDFS 244, and LPF 2-248 form an ET delay feedback circuit.

The ETDC 214 receives the filtered output signal from the LPF 2-248. The ETDC 214 determines the ET delay interval using the filtered output signal, such as by determining an ET Delay producing a lowest value of the filtered output signal using the teachings and disclosures herein.

In an embodiment, the ETDC 214 may provide a plurality of ET delays across a range and in increments related to a sample interval associated with the transmitter 2-110. For example, in an Long Term Evolution (LTE™) wireless device including a 124.8 MHz sample rate and a corresponding sample interval of 8 nanoseconds, the ETDC may provide an ET Delay selectable between zero and 16 nanoseconds in increments of 0.445 nanoseconds.

Figure 3:
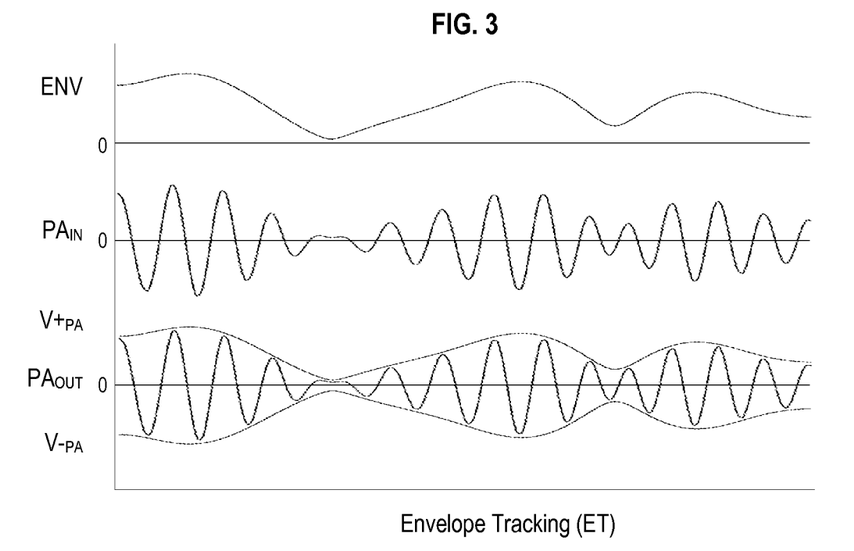
FIG. 3 depicts waveforms related to the circuit shown in FIG. 2.

FIG. 3 depicts waveforms illustrating envelope tracking as may be performed using circuits such as those shown in FIG. 2. The modulated RF signal $PA_{IN}$ is a phase and amplitude modulated RF signal received by a PA. The envelope signal ENV shows an envelope of the modulated RF signal $PA_{IN}$.

PA power supply voltages $V+_{PA}$ and $V-_{PA}$ track the envelope signal ENV at all times. Accordingly, magnitudes of the PA power supply voltages $V+_{PA}$ and $V-_{PA}$ are equal to or slightly larger than the magnitudes of the peak output voltages of the PA output signal $PA_{OUT}$. As a result, the PA operates efficiently and with less power wasted as heat.

Figure 4:
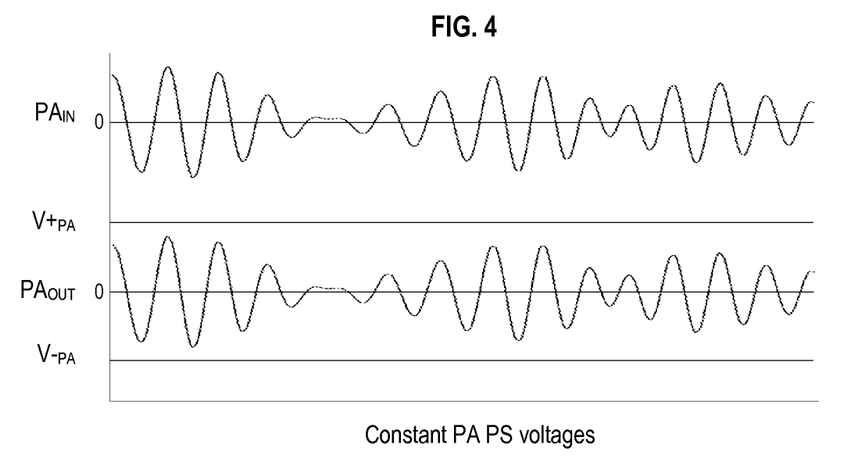
FIGS. 4 and 5 depict waveforms related to other circuits.
Figure 5:
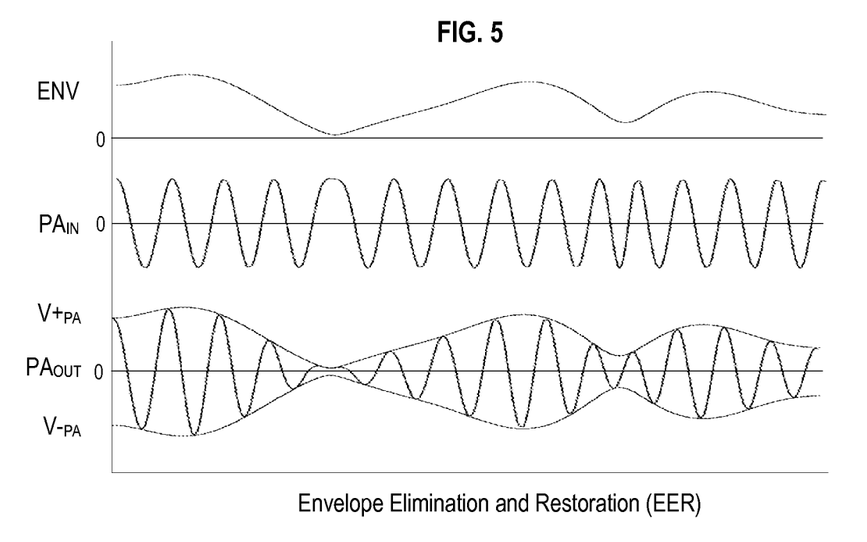

FIGS. 4 and 5 illustrate other amplification techniques used with power amplifiers, and illustrate distinctions between those other techniques and envelope tracking.

FIG. 4 illustrates an amplification scheme using a constant value for each of the PA power supply voltages $V+_{PA}$ and $V-_{PA}$. As a result, differences between a magnitude of the PA power supply voltages $V+_{PA}$ and $V-_{PA}$ and magnitudes of the PA output signal $PA_{OUT}$ are large when the peak output voltages of the PA output signal $PA_{OUT}$ are low. Accordingly, the PA operates inefficiently and a substantial amount of power is wasted as heat.

In an embodiment, the constant values for each of the PA power supply voltages $V+_{PA}$ and $V-_{PA}$ are varied from time to time. For example, first values of PA power supply voltages $V+_{PA}$ and $V-_{PA}$ may be used during a first time period, and second values of PA power supply voltages $V+_{PA}$ and $V-_{PA}$ may be used during a second time period. However, within each time period the PA power supply voltages $V+_{PA}$ and $V-_{PA}$ are held constant and do not vary according to the envelope of the PA output signal $PA_{OUT}$. Since differences between the magnitudes of the PA power supply voltages $V+_{PA}$ and $V-_{PA}$ and those of the PA output signal $PA_{OUT}$ remain during each time period, the PA still operates inefficiently.

FIG. 5 illustrates an amplification scheme using Envelope Extraction and Restoration (EER) and illustrates how EER differs from ET. During baseband processing, amplitude information is extracted from the baseband signal as an envelope signal. Within a mixer/balun modulating an RF carrier, only the phase information from the baseband signal is used to modulate the RF carrier. Therefore, in EER, a modulated RF signal $PA_{IN}$ received by a PA is a phase modulated RF signal without amplitude modulation.

The amplitude information from the baseband signal is restored by varying the gain of the PA. The gain of the PA is varied by varying the PA power supply voltages $V+_{PA}$ and $V-_{PA}$ according to the envelope signal. Because EER varies the gain of the PA to restore the amplitude information, the PA does not operate as an iso-gain circuit when EER is used.

Figure 6:
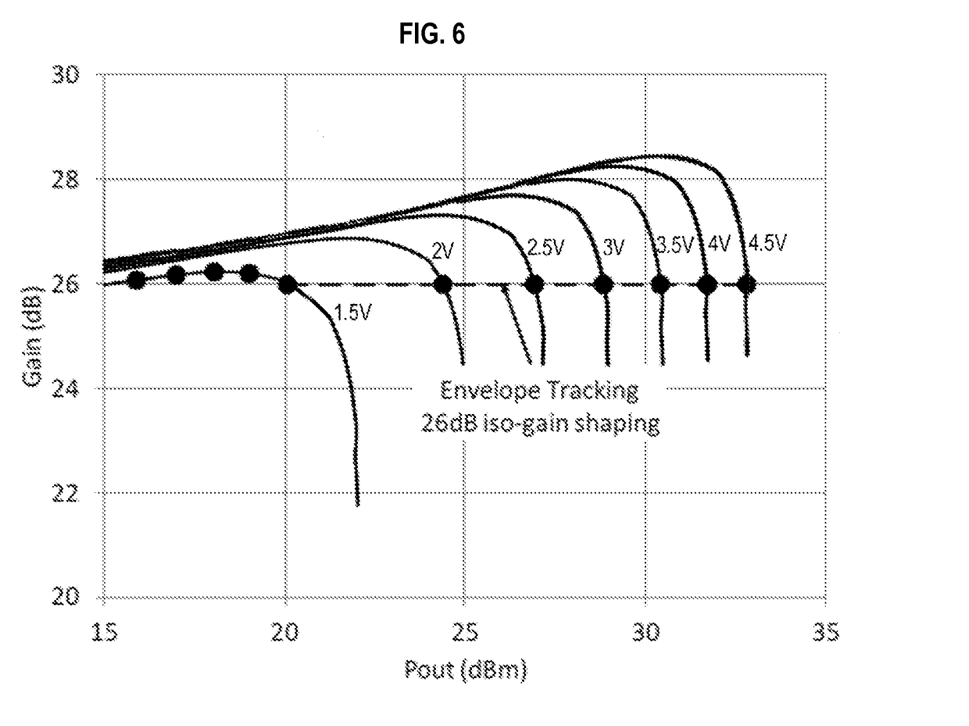
FIG. 6 illustrates a gain variation of a PA.

FIG. 6 illustrates a gain of a PA according to a power supply voltage and a power output of the PA. The horizontal axis represents the power output of the PA in decibels above 1 milliwatt (dBm). The vertical axis represents the gain of the PA. Each graph illustrated by a solid line corresponds to gain values when a PA power supply voltage is held constant.

For example, the curve labeled "2.5V" represents the gain of the PA when the PA power supply voltage is held constant at 2.5 volts (V) as the power output of the PA varies. The curve shows that the gain increases as the power output increases to about 25 dBm, then decreases as power output increases beyond 25 dBm, decreasing rapidly when the power output reaches 26 dBm. The other curves corresponding to other power supply voltages show similar increases and decreases but at different power output levels.

The circles and dashed lines of the graph illustrate how the PA can be operated in an iso-gain manner by controlling the PA power supply voltage. By varying the power supply voltage according to the required power output—for example, by using a 1.5V power supply voltage when 20 dBM power output is required, a 2V power supply voltage when 24 dBm power output is required, a 2.5 V power supply voltage when 27 dBm is required, and so forth, the gain of the PA can be maintain at a nearly constant gain, such as the 26 dB gain shown in FIG. 6. Operating the PA at a constant gain by varying a power supply voltage according to the required power output is called iso-gain shaping.

In an embodiment, a gain of a PA is controlled in real-time using envelope tracking of a baseband signal used to generate the signal amplified by the PA. An envelope of the baseband signal determines the required power output of the PA. Accordingly, the gain is controlled by continuously varying one or more power supply voltages of the PA according to the envelope of the baseband signal.

The changes in the PA power supply must have an acceptable time alignment (TA) with the changes in the required power output of the PA. Otherwise, the PA may have a gain less than the required gain (gain compression) and/or have a gain more than required gain (gain expansion), and accordingly the power output of the PA may be lower or greater than the required power output. Gain compression and gain expansion create distortion in the output of the PA, including distortion that generates signals in adjacent channels and degrades an Adjacent Channel Leakage-Power Ratio (ACLR).

Figure 7:
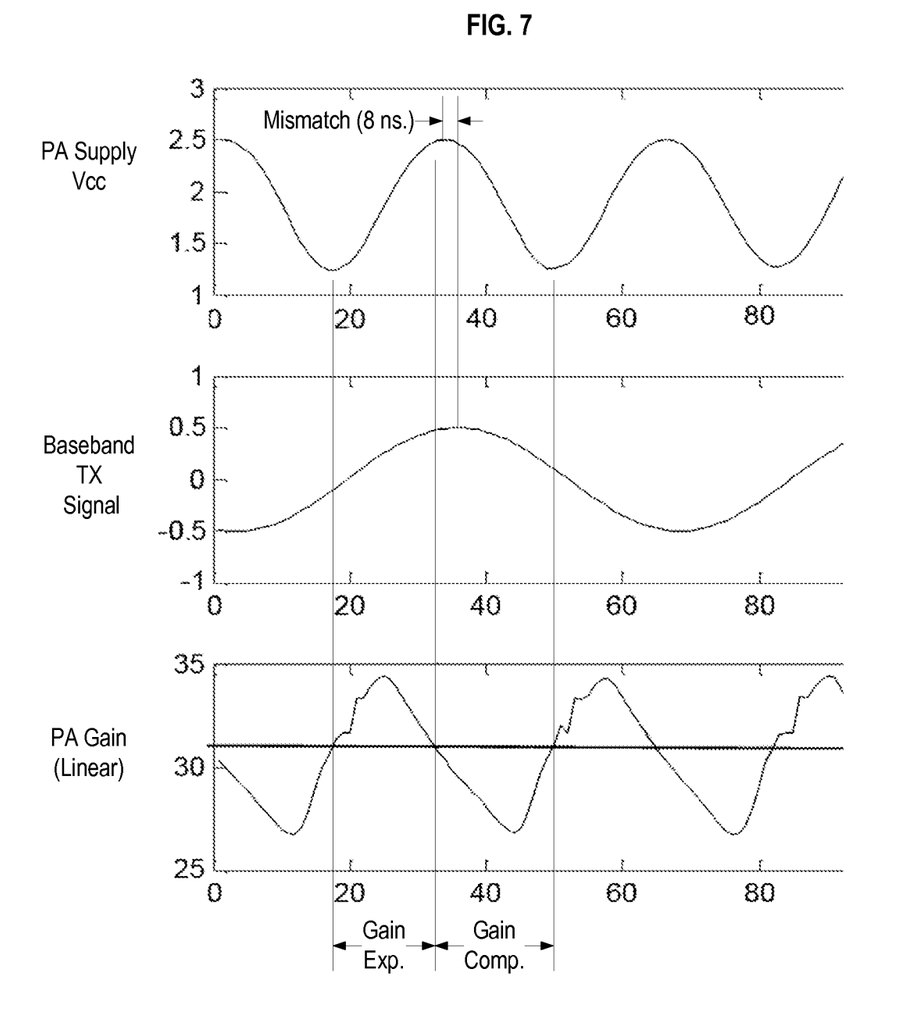
FIG. 7 depicts waveforms illustrating the effect of a mismatch of a TA.

FIG. 7 illustrates the effect of mismatched TA between in the PA power supply and the required power output of the PA. The PA supply voltage Vcc varies according to the magnitude of the baseband transmit (TX) signal. The baseband TX signal determines the envelope of the RF signal received by the PA, and therefore determines the required power output of the PA.

In FIG. 7, the mismatch of the TA is 8 nanoseconds. As a result, the PA supply voltage Vcc begins increasing 8 nanoseconds before the envelope of the RF input signal received by the PA begins increasing, and begins decreasing 8 nanoseconds before the envelope of the RF input signal received by the PA begins decreasing.

When the PA supply voltage Vcc increases before the corresponding increase in the envelope of the RF signal, the PA supply voltage Vcc may be greater than required to produce a desired gain of the PA and therefore a gain expansion occurs. Gain expansion occurring is shown in FIG. 7 during the time period labelled as "Gain Exp." When the gain expansion occurs in FIG. 7, the PA gain is higher than the desired gain (e.g., 31) indicated as a solid line in the PA gain curve.

When the PA supply voltage Vcc decreases before the corresponding decrease in the envelope of the RF signal, the PA supply voltage Vcc may be less than required to produce a desired gain of the PA and therefore a gain compression occurs. Gain compression occurring is shown in FIG. 7 during the time period labelled as "Gain Comp." When the gain compression occurs in FIG. 7, the PA gain is lower than the desired gain (e.g., 31) indicated as a solid line in the PA gain curve.

As can be seen in FIG. 7, when a signal having of a frequency is used as the baseband TX signal, a mismatch of the TA between the PA supply voltage Vcc and the required power output of the PA produces a variation in the gain of the PA at twice the frequency. That is, the gain of the PA includes a component at the second harmonic of the baseband TX signal.

Figure 8:
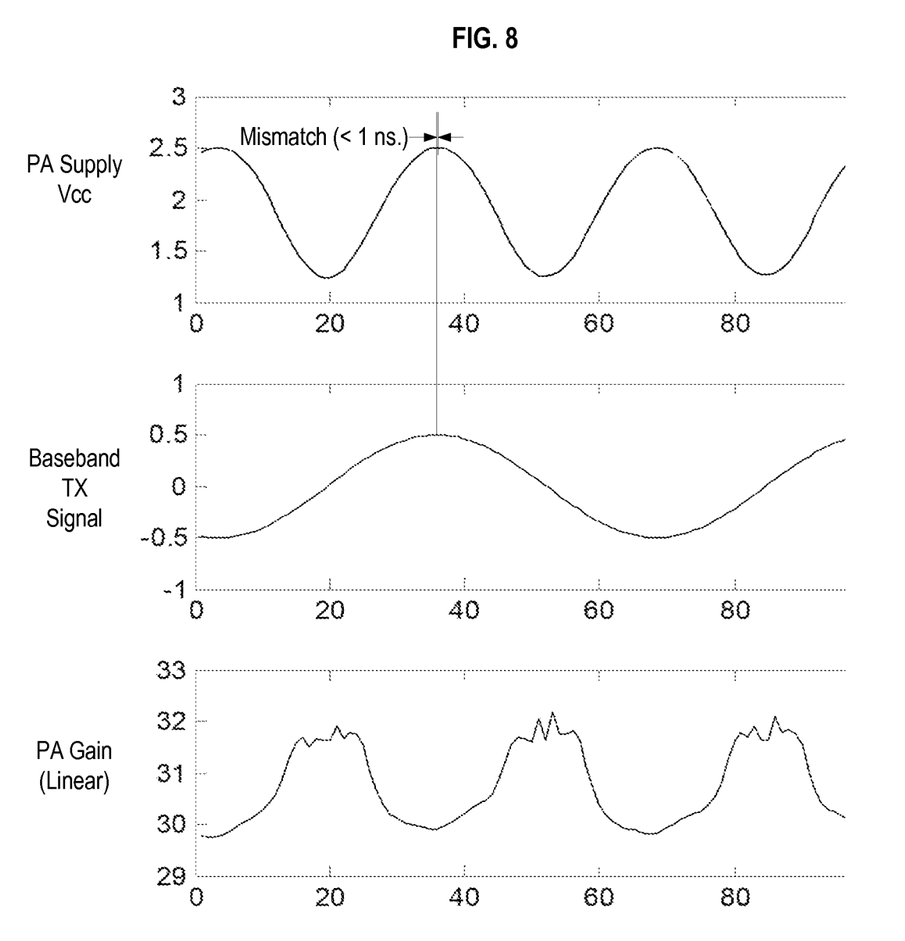
FIG. 8 depicts waveforms illustrating the effect of reducing a mismatch of a TA.

FIG. 8 illustrates a reduction in gain compression and gain expansion when a mismatch of a TA between a PA supply voltage Vcc and an envelope of an RF signal received by a PA is reduced relative to the mismatch shown in FIG. 7 (e.g., eight nanoseconds). The mismatch of the TA shown in FIG. 8 is less than one nanosecond. As discussed with reference to FIG. 7, the baseband TX signal of FIG. 8 corresponds to the envelope of the RF signal $PA_{IN}$ input to the PA simultaneously with the PA supply voltage Vcc.

Comparing FIG. 7 to FIG. 8, the variation in the gain of the PA is substantially reduced. FIG. 7 shows the gain varying from a low of approximately 27 to a high of approximately 34. In contrast, FIG. 8 shows the gain varying from a low of approximately 30 to a high of approximately 32. As in FIG. 7, the gain of the PA shown in FIG. 8 varies at twice the frequency of the baseband TX signal.

Figure 9:
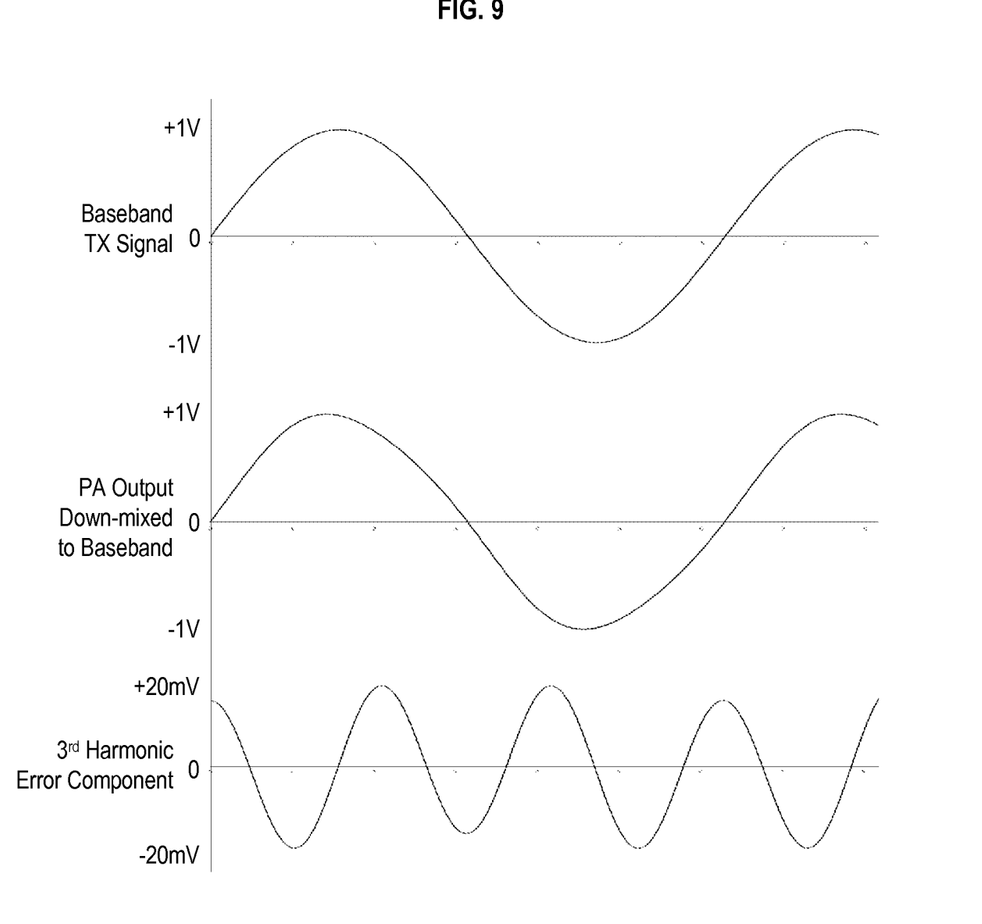
FIG. 9 depicts waveforms illustrating an output signal error component related to a mismatch of a TA.

FIG. 9 illustrates another effect of a mismatch of a TA between a PA supply voltage and a required power output of a PA. A baseband TX signal represents the signal used to modulate the input to the PA, and accordingly determines the required power output of the PA. A PA Output Downmixed to Baseband signal represents a baseband signal produced by down-mixing the output of the PA using the TX local oscillator, and includes distortions introduced by the mismatch of the TA. A $3^{rd}$ Harmonic Error Component signal represents a difference between the baseband TX signal and the PA Output Downmixed to Baseband, and therefore corresponds to the distortions in the PA output due to the mismatch of the TA.

The $3^{rd}$ Harmonic Error Component signal illustrates that the gain expansion and gain compression introduced by the mismatch of the TA produces an error component in the PA output having a frequency of three times that of a frequency of the baseband TX signal, that is, a third harmonic error component. The third harmonic error component is attributable to a mixing of the baseband TX signal and variations of the gain of the PA corresponding to the second harmonic of the baseband TX signal. That is, the TA mismatch introduces a spur into the PA gain having a frequency of twice the frequency of the baseband TX signal, which produces an error component having a frequency of three times the baseband TX signal.

The greater the variation in the gain of the PA caused by a mismatch of the TA, the greater the magnitude of the third harmonic error component. Accordingly, the third harmonic error component can be reduced by reducing the mismatch of the TA.

Figure 10:
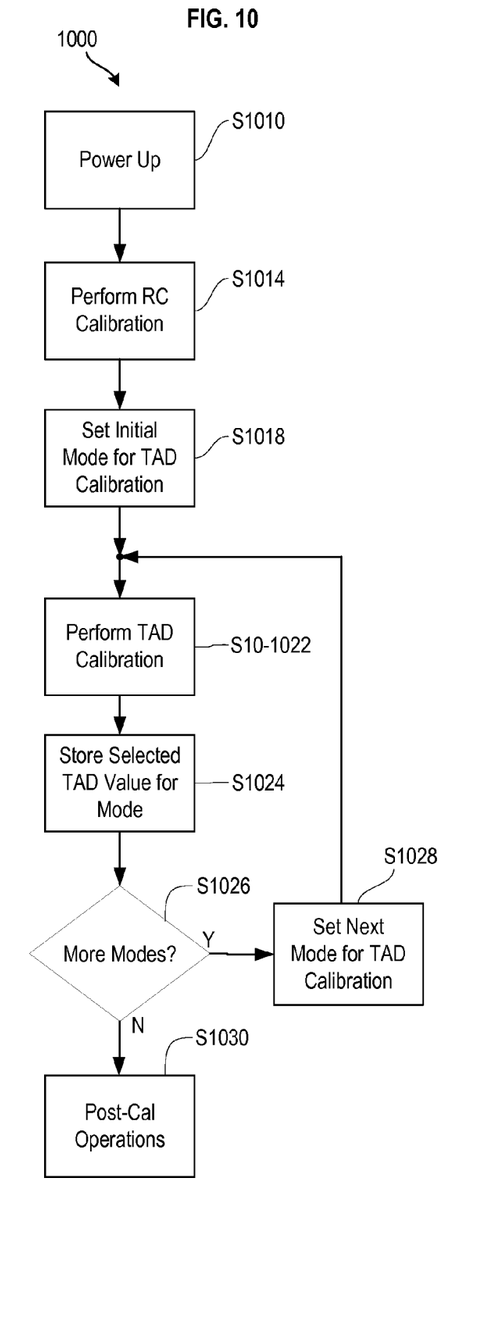
FIG. 10 shows a flow chart outlining a process of reducing a mismatch of a TA in accordance with an embodiment.

FIG. 10 is a flowchart of a process 1000 of determining a Time Alignment Delay (TAD) in a device according to an embodiment. The TAD determines a TA between one or more power supply voltages of an amplifier of the device and an input signal of the amplifier. In an embodiment, the amplifier uses Envelop Tracking (ET).

At S1010, a power-up initialization process is performed. In an embodiment, the power-up initialization is performed as part of a factory test and/or when the device is turned on. At S1014, a Resistor and Capacitor (RC) calibration process is performed. The RC calibration process measures values related to analog resistive and/or capacitive elements of the device. A person of skill in the art in light of the teachings and disclosures herein would understand how to perform the power-up initialization and RC calibration processes.

At S1018, an initial mode for TAD calibration is determined. TAD calibration is conducted for one or more modes of the device, wherein each mode includes a different transmission bandwidth, a different sample rate, and/or a different low pass filter configuration. After determining the initial mode to calibrate, the device is configured to operate in the initial mode.

At S10-1022, a TAD calibration process is performed. The TAD calibration process produces a TAD value that minimizes the mismatch of the TA. The TAD calibration process is discussed below in relation to FIGS. 11-15.

At S1024, a selected TAD value produced using the TAD calibration produced at S10-1022 is stored in a memory as the delay calibration of the corresponding mode. In an embodiment, the stored TAD value is a value that is considered to provide the best TAD value among values produced using the TAD calibration. Until the next TAD calibration for the mode, the stored TAD value is used to control a TA when the device operates in the mode.

At S1026, the process 1000 determines whether there are more modes to perform TAD calibration for. If there are more modes to calibrate, the process 1000 proceeds to S1028. Otherwise, the process 1000 proceeds to S1030.

At S1028, a next mode for TAD calibration is determined. After determining the next mode to calibrate, the device is configured to operate in the next mode. The process 1000 then proceeds to S10-1022.

At S1030, post-calibration operations are performed. The post-calibration operations may include one or more initializations, calibrations, tests, and/or normal operations of the device. The post-calibration operations may include one or more factory test operations. A person of skill in the art in light of the teachings and disclosures herein would understand how to perform the post-calibration operations.

Figure 11:
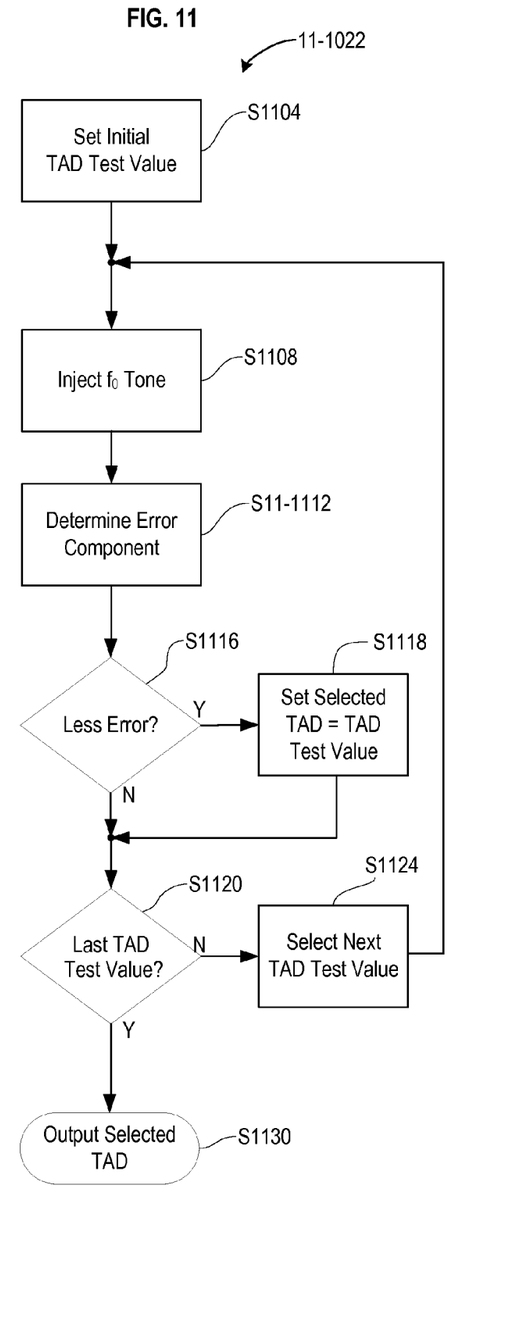
FIG. 11 shows a flow chart outlining a process of determining a TA delay in accordance with an embodiment.

FIG. 11 is a flowchart of a process 11-1022 of performing TAD calibration of a circuit according to an embodiment, such as may be used at S10-1022 of process 1000 shown in FIG. 10. The process 11-1022 generates and selects a TAD value that reduces a distortion in an output of an amplifier of the circuit caused by a mismatch of a TA between one or more power supply voltages of the amplifier and an input signal of the amplifier.

At S1104, a TAD test value is set to an initial TAD test value. The initial TAD test value is determined using a predetermined value, a value programmed into the device during manufacturing, a previously selected TAD value from a prior TAD calibration, or a combination thereof. A TA delay circuit used to determine the TA is configured according to the TAD test value.

At S1108, an F0 tone having a frequency $f_0$ is generated and provided to an input of the circuit. The F0 tone determines the envelope of an output signal of the amplifier and therefore determines a required power output of the amplifier.

In an embodiment, the circuit is a transmitter, the F0 tone is provided at a baseband signal input of the transmitter, and the output signal of the amplifier is an RF signal modulated using the F0 tone. The amplifier of the transmitter uses Envelope Tracking (ET).

The frequency f0 is selected to be high enough to provide sufficient sensitivity to a mismatch of the TA and low enough to be within the bandwidth provided by the circuit. For example, in an embodiment including a Long Term Evolution (LTE™) wireless device, a frequency f0 of 3.84 MHz is used to calibrate an LTE10 mode, and/or a frequency f0 of 7.68 MHz is used to calibrate an LTE20 mode. In an embodiment, the F0 tone is generated by repeating a sequence {0, X, 0, –X} at a transceiver input sample rate, where X is a constant.

At S11-1112, an error component related to a harmonic of the frequency f0 is determined using the output of the amplifier. The error component corresponds to a magnitude of a distortion introduced into the output of the amplifier because of a mismatch of the TA. The error component is determined using the process 12-1112 shown in FIG. 12 and/or the process 13-1112 shown in FIG. 13.

At S1116, the process 11-1022 determines whether the error component produced at S11-1112 indicates less error than a previously-selected error component associated with a previous TAD test value. If the TAD test value is the initial TAD test value, the error component is determined to indicate less error. If the error component indicates less error, the process 11-1022 proceeds to S1118. Otherwise, the process 11-1022 proceeds to S1120.

At S1118, a selected error component (e.g., the best error component) is set to the error component and associated with the TAD test value. The process 11-1022 proceeds to S1120.

At S1120, the process 11-1022 determines whether to try another TAD test value. If an additional TAD test value is to be tried, the process 11-1022 proceeds to S1124. Otherwise, the process 11-1022 proceeds to S1130.

Determining whether to try another TAD test value may be done using a counter, a requirement related to the selected error component and/or a result of a previous calibration. For example, additional TAD test values may be tried until a maximum number of tries is reached, the best error component is lower than a predefined value, the selected error component is less than or equal to an error component selected from a previous calibration, a TAD test value within a region of acceptable error components is identified, or a combination thereof.

At S1124, the TAD test value is set to a next TAD test value. The next TAD test value may be determined using a list of TAD test values to try, a binary search of a range of TAD test values, an interpolation or extrapolation using a plurality of previously-tried TAD values and the corresponding error components, or a combination thereof. In an embodiment, the next TAD test value may be determined according to capabilities of the delay circuit used to determine the TA, such as by selecting the next TAD test value from the delay values that the delay circuit can provide. The process 11-1022 proceeds to S1108.

At S1130, the process 11-1022 outputs the TAD test value associated with the selected error component.

Figure 12:
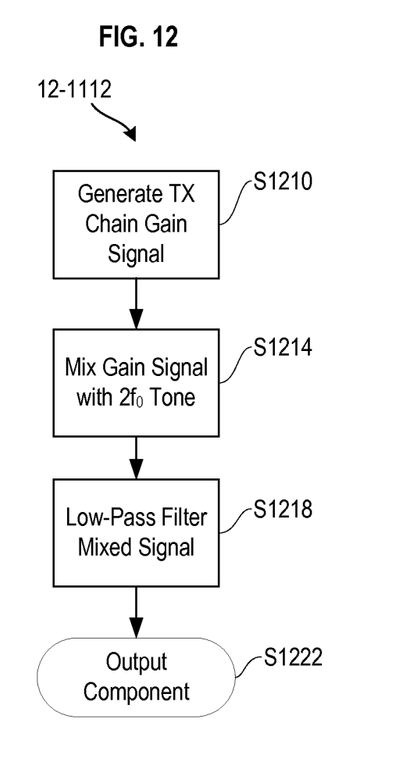
FIGS. 12 and 13 show flow charts outlining processes of determining an error component of a signal in accordance with embodiments.

FIG. 12 is a flowchart of a process 12-1112 of determining an error component of an output signal generated by a circuit according to an embodiment, such as may be used at S11-1112 of process 11-1022 shown in FIG. 11. The error component is determined according to a gain of the circuit and is related to a harmonic of a frequency $f_0$ of an input signal of the circuit. In an embodiment, the circuit includes a PA.

At S1210, a gain signal corresponding to a gain of the circuit is determined using an output signal of the circuit and an input signal of the circuit. A person of skill in the art in light of the teachings and disclosures herein would understand how to generate the gain signal. In an embodiment, the gain signal is generated by an auxiliary receiver such as AUXRX 240 shown in FIG. 2.

At S1214, the gain signal is frequency-mixed with a second harmonic of the frequency $f_0$ to generate a mixer output signal. The mixer output signal includes a substantially zero-frequency component, that is, a DC component, corresponding to the magnitude of a component of the gain signal having a frequency corresponding to the second harmonic of the frequency $f_0$. A person of skill in the art in light of the teachings and disclosures herein would understand how to generate the second harmonic and how to mix the second harmonic with the gain signal to generate the mixer output signal.

Figure 14:
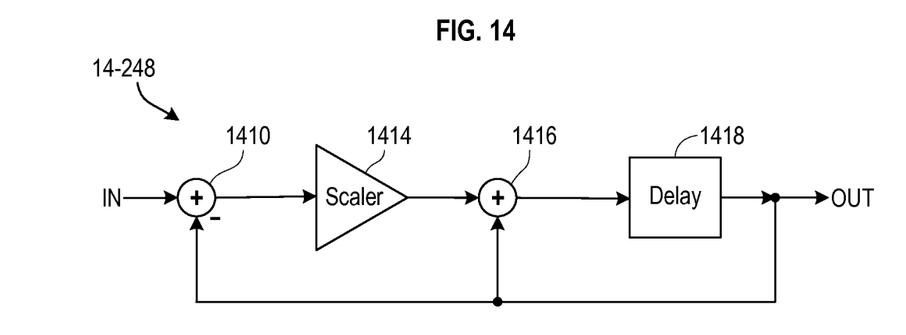
FIG. 14 is a circuit diagram of a low pass filter (LPF) in accordance with an embodiment.
Figure 15:
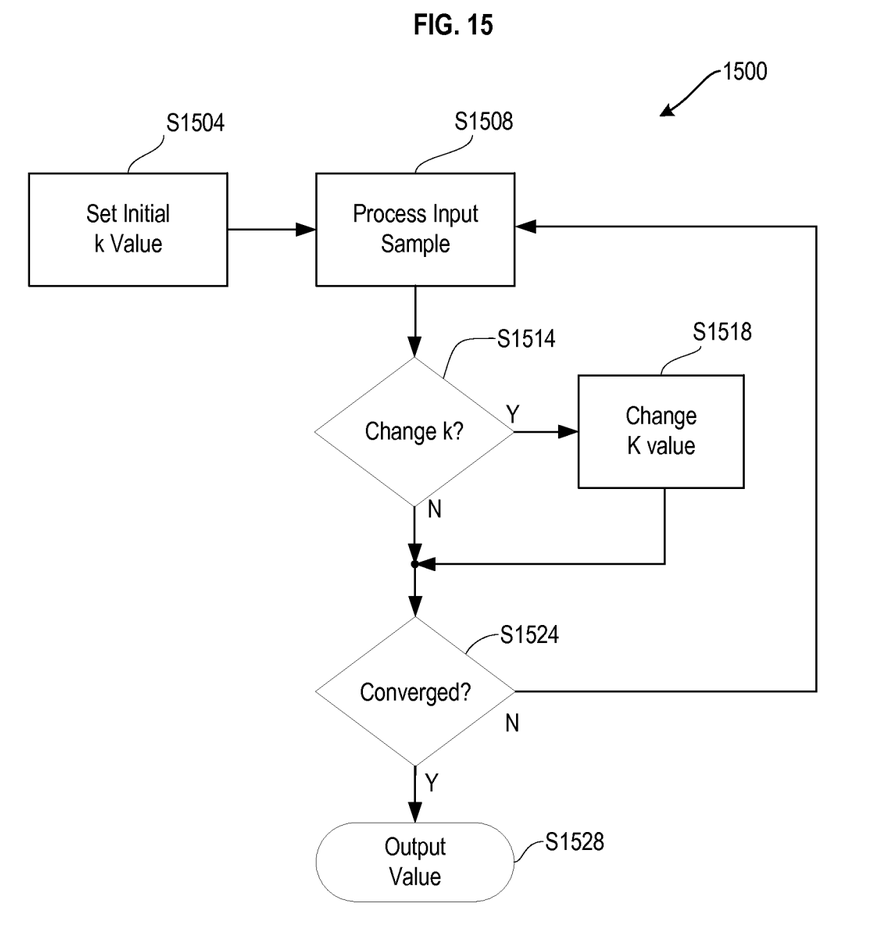
FIG. 15 shows a flow chart outlining a process of filtering a signal in accordance with an embodiment.

At S1218, the mixer output signal is filtered to remove high-frequency components, that is, it is low-pass filtered. An embodiment of a circuit and a process that may be used to low-pass filter the mixer output signal are illustrated in FIGS. 14 and 15, respectively. A person of skill in the art in light of the teachings and disclosures herein would understand that other circuits and processes are capable of performing the low-pass filtering of the mixer output signal.

In an embodiment, the filtering at S1218 proceeds until the filtered mixer output signal converges, such as by filtering for a predetermined time period or filtering until a change in the filtered mixer output signal over time drops below a threshold value.

At S1222, when the filtered mixer output signal has converged, the filtered mixer output signal is output as the error component.

Figure 13:
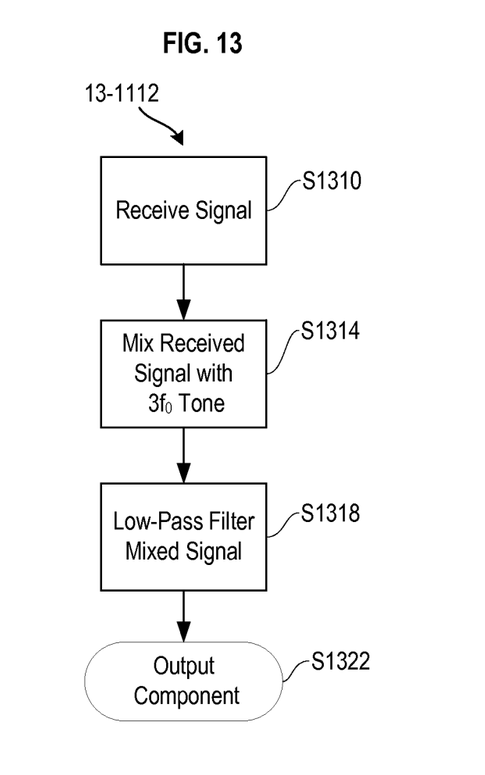

FIG. 13 is a flowchart of a process 13-1112 for determining an error component of an output signal generated by a circuit according to an embodiment, such as may be used at S11-1112 of process 11-1022 shown in FIG. 11. The error component is determined according to the amplitude of the output signal and is related to a harmonic of a frequency $f_0$ of an input of the amplifier.

At S1310, the output signal is received to produce a received signal. In an embodiment, receiving the output signal includes demodulating a signal using an RF carrier signal to generate a baseband received signal. Receiving the output signal may be performed by an auxiliary receiver such as AUXRX 240 shown in FIG. 2.

At S1314, the received signal is frequency-mixed with a third harmonic of the frequency $f_0$ to generate a mixer output signal. The mixer output signal includes a substantially zero-frequency component, that is, a DC component, corresponding to the magnitude of a component of the gain signal having a frequency corresponding to the third harmonic of the frequency $f_0$. A person of skill in the art in light of the teachings and disclosures herein would understand how to generate the third harmonic and how to mix the third harmonic with the gain signal to generate the mixer output signal.

At S1318, the mixer output signal is filtered to remove high-frequency components, that is, it is low-pass filtered. An embodiment of a circuit and a process that may be used to low-pass filter the mixer output signal are illustrated in FIGS. 14 and 15, respectively. A person of skill in the art in light of the teachings and disclosures herein would understand that other circuits and processes are capable of performing the low-pass filtering of the mixer output signal.

In an embodiment, the filtering at S1318 proceeds until the filtered mixer output signal converges, such as by filtering for a predetermined time period or filtering until a change in the filtered mixer output signal over time drops below a threshold value.

At S1322, when the filtered mixer output signal has converged, the filtered mixer output signal is output as the error component.

FIG. 14 illustrates an embodiment of a low-pass filter (LPF) 14-248 which may be included in LPF 2-248 of FIG. 2 and/or used to perform the low-pass filtering process of S1218 of FIG. 12 and/or S1318 of FIG. 13. The LPF 14-248 is an Infinite Impulse Response (IIR) filter having an input signal IN and an output signal OUT.

A first adder 1410 computes a difference of the input signal IN minus the output signal OUT. A scaler 1414 receives the difference and scales it using a scaling factor k to produce a scaled output.

The scaling factor k determines characteristics of the LPF 14-248 including the bandwidth and the rate at which the LPF 14-248 converges. In an embodiment, the scaler 1414 produces the scaled output by multiplying the difference by the scaling factor k. When the scaling factor k is a power of two and the difference includes a plurality of bits, multiplying the difference by the scaling factor k may be performed by shifting the bits. In an embodiment, the scaling factor k may vary during the operation of the LPF 14-248.

A second adder 1416 computes the sum of the scaled output and the output signal OUT. A delay circuit 1418 generates the output signal OUT by delaying the output of the second adder 1416 for a time period. In an embodiment, the time period of the delay corresponds to a sampling rate of the input signal IN.

In an embodiment, the LPF 14-248 is a digital IIR filter. All or a portion of the functionality provided by the LPF 14-248 may be provided by a CPU or DSP executing computer executable instructions embodied in a non-transitory computer-readable medium.

FIG. 15 is a flowchart of a process 1500 of performing low-pass filtering, such as may be used at S11-1112 of process 11-1022 shown in FIG. 11. In an embodiment, the process 1500 uses a LPF filter such as the LPF 14-248 of FIG. 14.

The process 1500 performs "gearshifting" of the LPF by altering a bandwidth of the LPF. A person of skill in the art would understand that the LPF 14-248 could instead operate with a constant bandwidth, that is, without gearshifting, rather than being operated according to the process 1500.

At S1504, an initial value for a scaling factor k is selected. The initial value for k is selected to provide a large filter bandwidth and a fast convergence time. In an embodiment, the initial value is $2^{-1}$.

At S1508, the LPF processes a sample from an input signal. In an embodiment, processing the sample includes subtracting a present value of an output signal of the LFP from the sample to produce a difference and scaling the difference using the scaling factor k. The scaled difference is added to the present value of the output signal to produce a next value of the output signal. The value of the output signal is set to the next value after a delay, for example, a delay corresponding to one sampling period of the input signal.

At S1514, the process 1500 determines whether to change the scaling factor k. Whether to change the scaling factor k may be performed using a current value of the scaling factor k, a count of the input samples processed, a value of the output signal, a difference between successive values of the output signal, or a combination thereof. For example, the number of input samples between changes of the scaling factor k may be smaller when the scaling factor k corresponds to a higher LPF bandwidth and larger when the scaling factor k corresponds to a lower LPF bandwidth. If changing the scaling factor k is determined, the process 1500 proceeds to S1518, otherwise the process 1500 proceeds to S1524.

At S1518, the scaling factor k is set to a new value smaller than the previous value of the scaling factor k. In an embodiment, each new value of the scaling factor k is equal to the previous value of the scaling factor k divided by a power of two. For example, the scaling factor k may take on a sequence of values such as $2^{-1}$, $2^{-2}$, $2^{-3}$, and so on. The process 1500 proceeds to S1524.

At S1524, the process 1500 determines whether the output signal of the LPF has converged. Whether the output signal has converged may be determined using a count of the number of input samples processed, a value of the scaling factor, a value of the output signal, a difference between successive values of the output signal, or a combination thereof. In an embodiment, the output signal is determined to be converged when the scaling factor k is less than a terminal value, for example, $2^{-12}$. When the output signal of the LPF has not converged, the process 1500 proceeds to S1508 and processes the next input sample. Otherwise, the process 1500 proceeds to S1528.

At S1528, the output signal of the LPF is returned. In an embodiment, the value of the output signal that is returned is retained as the initial value of the output signal of the LPF for the next performance of the process 1500. In an embodiment, the output signal of the LPF is reset to a predetermined value before the next performance of the process 1500.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A method comprising:
    setting a circuit to a mode;
    providing a test tone having a first frequency to the circuit for use in calibrating the circuit;
    generating an envelope signal according to the test tone;
    generating, using an amplifier, an output signal corresponding to the test tone, wherein a power supply voltage of the amplifier is controlled according to the envelope signal;
    generating a received signal based on the output signal of the circuit, wherein the received signal includes a component having a second frequency that is a harmonic of the first frequency;
    determining a magnitude of the component having the second frequency in the received signal; and
    adjusting a delay of the circuit corresponding to the mode according to the magnitude of the component.

2. The method of claim 1, wherein the mode is a first mode, the test tone is a first test tone, the received signal is a first received signal, the output signal is a first output signal, and the delay is a first delay, and the method further comprises:
    setting the circuit to a second mode;
    providing a second test tone having a third frequency to the circuit for use in calibrating the circuit;
    generating a second received signal based on a second output signal of the circuit, the second received signal including a component having a fourth frequency that is a harmonic of the third frequency;
    determining a magnitude of the component in the second received signal; and
    adjusting a second delay of the circuit corresponding to the second mode according to the magnitude of the component in the second received signal.

3. The method of claim 1, wherein the received signal includes a value corresponding to a gain of the circuit, and the second frequency is a second harmonic of the first frequency.

4. The method of claim 1, wherein the received signal is a baseband signal based on the output signal of the circuit, and the second frequency is a third harmonic of the first frequency.

5. The method of claim 4, wherein the output signal is an RF signal.

6. The method of claim 1, further including:
    setting the delay of the circuit to a first delay value;
    when the delay of the circuit is set to the first delay value, determining the magnitude of the component to produce a first error component;
    setting the delay of the circuit to a second delay value;
    when the delay of the circuit is set to the second delay value, determining the magnitude of the component to produce a second error component;
    comparing the first error component to the second error component;
    when the first error component is less than the second error component, setting a delay calibration associated with the mode to the first delay value; and
    when the first error component is not less than the second error component, setting the delay calibration associated with the mode to the second delay value.

7. The method of claim 1, wherein the circuit includes a transmitter.

8. The method of claim 1, wherein the delay is an envelope tracking time alignment delay.

9. A method comprising:
    setting a circuit to a mode;
    providing a test tone having a first frequency to the circuit for use in calibrating the circuit;
    generating a received signal based on an output signal of the circuit, wherein the received signal includes a component having a second frequency that is a harmonic of the first frequency;
    determining a magnitude of the component having the second frequency in the received signal; and
    adjusting a delay of the circuit corresponding to the mode according to the magnitude of the component,
    wherein determining the magnitude of the component includes:
    generating a harmonic signal having the second frequency;
    generating a mixer output signal by frequency mixing the received signal and the harmonic signal; and
    filtering the mixer output signal to remove high frequency components from the mixer output signal and generate a filtered output signal.

10. The method of claim 9, wherein filtering the mixer output signal includes reducing a bandwidth of a low pass filter from an initial bandwidth until the filtered output signal converges.

11. A circuit comprising:
    a test tone generator configured to provide a test tone having a first frequency as a baseband signal for the circuit, the circuit being set to a mode;
    a signal processor circuit configured to generate an envelope signal according to the baseband signal;
    a power amplifier (PA) configured to receive an input signal modulated by the baseband signal;

an envelope tracking (ET) circuit including an ET delay circuit (ETDC) and configured to modulate a power supply voltage of the PA according to the envelope signal; and an ET delay feedback circuit configured to generate a received signal based on an output of the PA and determine a magnitude of a component having a second frequency in the received signal, the component having the second frequency being a harmonic of the first frequency, wherein the ETDC adjusts a delay of the circuit corresponding to the mode according to the component.

12. The circuit of claim 11, wherein the mode is a first mode, the test tone is a first test tone, the received signal is a first received signal, the output signal is a first output signal, and the delay is a first delay, and wherein the ETDC is calibrated by:
setting the circuit to a second mode,
providing a second test tone having a third frequency to the circuit for use in calibrating the circuit,
generating a second received signal based on a second output signal of the circuit, the second received signal including a component having a fourth frequency that is a harmonic of the third frequency,
determining a magnitude of the component in the second received signal, and
adjusting a second delay of the circuit corresponding to the second mode according to the magnitude of the component in the second received signal.

13. The circuit of claim 11, wherein the received signal includes a value corresponding to a gain of the circuit, and the second frequency is a second harmonic of the first frequency.

14. The circuit of claim 11, wherein the received signal is a baseband signal based on the output signal of the PA, and the second frequency is a third harmonic of the first frequency.

15. The circuit of claim 14, wherein the output signal of the PA is an RF signal.

16. The circuit of claim 11, further comprising:
a digital frequency synthesizer configured to generate a harmonic signal having the second frequency and mix the received signal with the harmonic signal to output a mixer output signal; and
a low-pass filter to remove high frequency components from the mixer output signal and generate a filtered output signal.

17. The circuit of claim 16, wherein the low-pass filter includes a digital Infinite Impulse Response (IIR) filter, and
wherein the digital frequency synthesizer and the low pass filer are included in the ET delay feedback circuit.

18. The circuit of claim 11, wherein the ETDC is calibrated by:
setting a delay of the ETDC to a first delay value;
when the delay of the ETDC is set to the first delay value, determining the magnitude of the component to produce a first error component;
setting the delay of the ETDC to a second delay value;
when the delay of the ETDC is set to the second delay value, determining the magnitude of the component to produce a second error component;
comparing the first error component to the second error component;
when the first error component is less than the second error component, setting a delay calibration of the ETDC associated with the mode to the first delay value; and
when the first error component is not less than the second error component, setting the delay calibration of the ETDC associated with the mode to the second delay value.

19. The circuit of claim 11, wherein the circuit includes a transmitter.

20. The circuit of claim 11, wherein the ET circuit performs envelope tracking, and the delay is an envelope tracking time alignment delay.

* * * * *